(12) United States Patent
Lin et al.

(10) Patent No.: US 6,916,671 B2
(45) Date of Patent: Jul. 12, 2005

(54) GATE OXIDE MEASUREMENT APPARATUS

(75) Inventors: Yu-Chang Lin, Yunlin (TW); Ming-Cheng Chang, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 27 days.

(21) Appl. No.: 10/734,044

(22) Filed: Dec. 11, 2003

(65) Prior Publication Data

US 2005/0045878 A1 Mar. 3, 2005

(30) Foreign Application Priority Data

Sep. 2, 2003 (TW) ........................................ 92124186 A

(51) Int. Cl.$^7$ .............................................. H01L 21/66
(52) U.S. Cl. .............................. 438/14; 438/18; 257/48; 257/E21.521
(58) Field of Search ........................ 438/14, 18; 257/48, 257/E21.521, E21.523, E21.524, E21.53

(56) References Cited

U.S. PATENT DOCUMENTS

| | | | |
|---|---|---|---|
| 6,313,480 B1 * | 11/2001 | Zatelli et al. ................. | 257/48 |
| 6,465,267 B1 * | 10/2002 | Wang et al. ................... | 438/17 |
| 6,806,102 B2 * | 10/2004 | Yamauchi ..................... | 438/14 |
| 2003/0218473 A1 * | 11/2003 | Yamashita et al. .......... | 324/765 |

* cited by examiner

*Primary Examiner*—Trung Dang
(74) *Attorney, Agent, or Firm*—Quintero Law Office

(57) ABSTRACT

An apparatus for measuring a gate oxide thickness comprises a first active area, first to fifth wordlines, first and second bar-shaped trench capacitors, and first and second gate structures. The first active area with a width of at least 2F is disposed on a substrate. The first to fifth wordline is disposed on the substrate in a first direction, with a first predetermined space between each two wordlines, and first ends of the first to fifth wordlines are electrically connected. The first and second bar-shaped trench capacitors are disposed under the second and the fourth wordlines respectively with a second predetermined space between the first and second bar-shaped trench capacitors, and F is a minimum line width of the wordlines. The first and second gate structure are respectively disposed between the first bar-shaped trench capacitor and the second wordline and between the second bar-shaped trench capacitor and the fourth wordline.

14 Claims, 6 Drawing Sheets

GATE OXIDE MEASUREMENT APPARATUS

BACKGROUND OF THE INVENTION

1. Field of the Invention

The invention relates to a measuring apparatus, and more particularly to an apparatus for measuring the thickness of a gate oxide layer of a vertical transistor and a gate oxide thickness measurement.

2. Description of the Related Art

With the wide application of integrated circuits (ICs), several kinds of semiconductor devices with higher efficiency and lower cost are produced based on different objectives. The dynamic random access memory (DRAM) is an important semiconductor device in the information and electronics industry. Basically, a DRAM is an integrated circuit that stores data in binary form (e.g., "1" or "0") in a large number of cells.

Most DRAMs have one transistor and one capacitor in one DRAM cell. The memory capacity of the DRAM has reached 256 megabits. Therefore, integration increases size of the memory cell and the transistor must be reduced yield DRAM with higher memory capacity and higher processing speed. A 3-D capacitor structure can reduce the area occupied by memory cells on the semiconductor substrate. Accordingly 3-D capacitors, such as a deep trench capacitors, are applied in the fabrication of the DRAM with capacity of 64 megabits or greater. A conventional DRAM module with a plane transistor covers a larger area of the semiconductor substrate surface and cannot satisfy high integration requirements. Therefore, space saving vertical transistors have become a trend in memory cell fabrication.

However, in vertical transistors, the break down voltage of a gate oxide layer suffers when the width of the active area is altered. Conventional techniques do not provide a method or an apparatus to measure thickness of the gate oxide layer of the vertical transistor.

SUMMARY OF THE INVENTION

The present invention is directed to estimating a thickness of a gate oxide layer.

Accordingly, the present invention provides a apparatus for measuring a gate oxide layer disposed in a scribe line region, comprising, a first active area disposed on a substrate, a first active area with a predetermined width with of at least 2F, first to fifth wordlines disposed on the substrate in a first direction with a first predetermined space between each two wordlines, and the first ends of the first to fifth wordlines are electrically connected. First and second bar-shaped trench capacitors are disposed under the second and the fourth wordlines respectively, with a second predetermined space between the first and second bar-shaped trench capacitors, the first and second bar-shaped trench capacitors are longer than the first active area; wherein the first space is smaller than the second space, and F is a minimum line width of the wordlines; and first and second gate structures are respectively disposed between the first bar-shaped trench capacitor and the second wordline and between the second bar-shaped trench capacitor and the fourth wordline, each gate structure comprising a gate conducting layer and a gate oxide layer, wherein the gate conducting layers are electrically connected to the wordlines respectively.

The present invention also provides agate oxide thickness measurement. A wafer with ascribe line and a memory cell area is provided. A measuring apparatus is formed on the scribe line, and a plurality of memory cells with vertical transistors is formed in the memory cell area, and each vertical transistor has a gate oxide layer. The measuring apparatus comprises a first active area, first to fifth wordlines, first and second bar-shaped trench capacitors, and first and second gate structures. The first active area is disposed on a substrate, and has a predetermined width of at least 2F. The first to fifth wordlines are disposed on the substrate in a first direction, with a minimum line width of F between each two wordlines, and the first ends of the first to fifth wordlines are electrically connected. The first and second bar-shaped trench capacitors are disposed under the second and fourth wordlines respectively and are longer than the first active area, a predetermined space of 3F between exists between the first and second bar-shaped trench capacitors. The first and second gate structures are respectively disposed between the first bar-shaped trench capacitor and the second wordline and between the second bar-shaped trench capacitor and the fourth wordline, each gate structure comprising a gate conducting layer and a gate oxide layer, wherein the gate conducting layers are electrically connected to the wordlines respectively. An equivalent capacitance between the first conducting and the first active area is measured. Thickness of the gate oxide layer of the measuring apparatus is estimated according to the equivalent capacitance. The gate oxide layer thickness of each vertical transistor is estimated according to the thickness of the gate oxide layer of the measuring apparatus.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

The present invention provides an apparatus for measuring a thickness of a gate oxide layer of a vertical transistor and a gate oxide thickness measurement.

Figure 1:
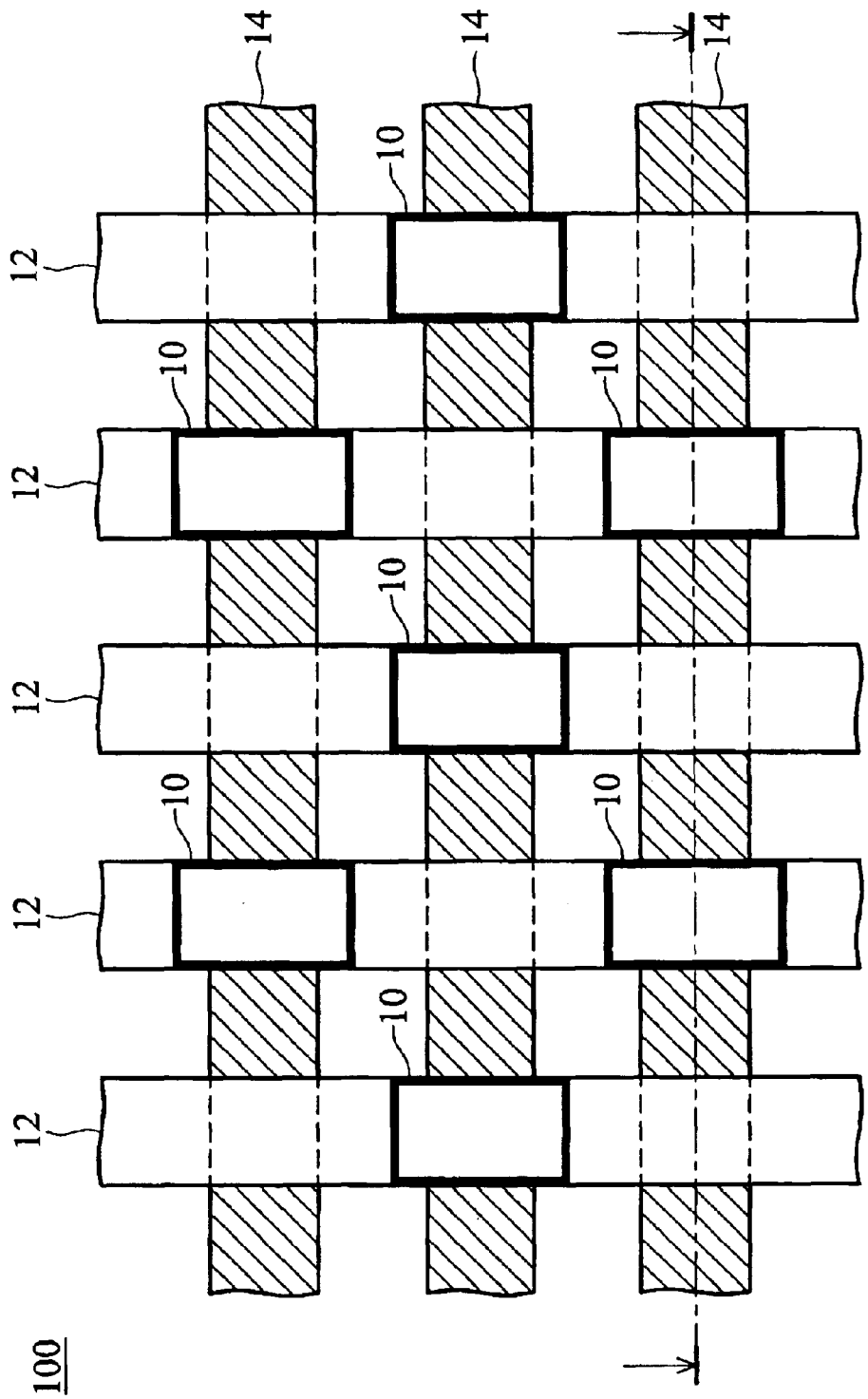
FIG. 1 shows a layout of a memory cell in a memory cell area of the present invention.
Figure 2:
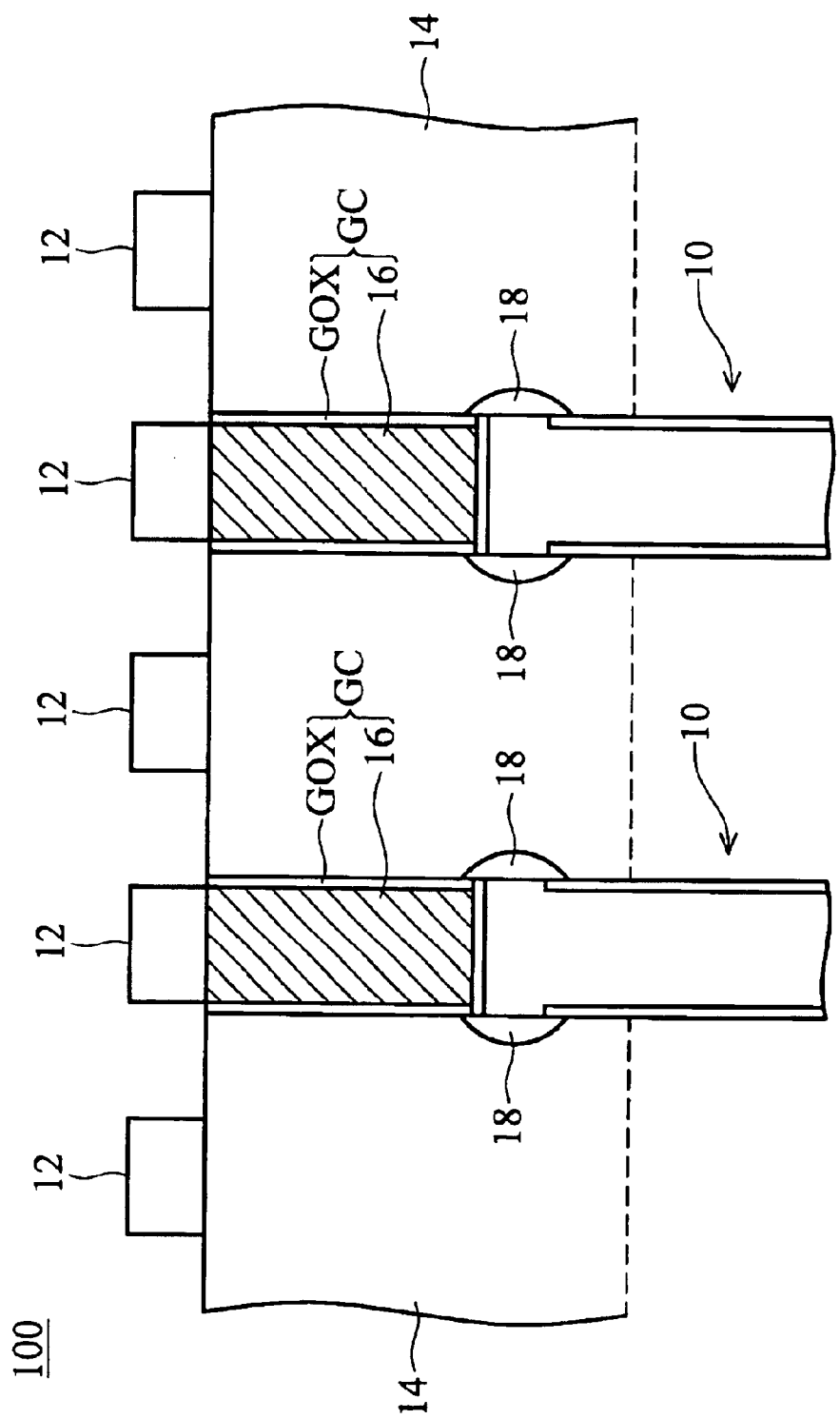
FIG. 2 is across-section of the memory cell of the present invention.
Figure 3:
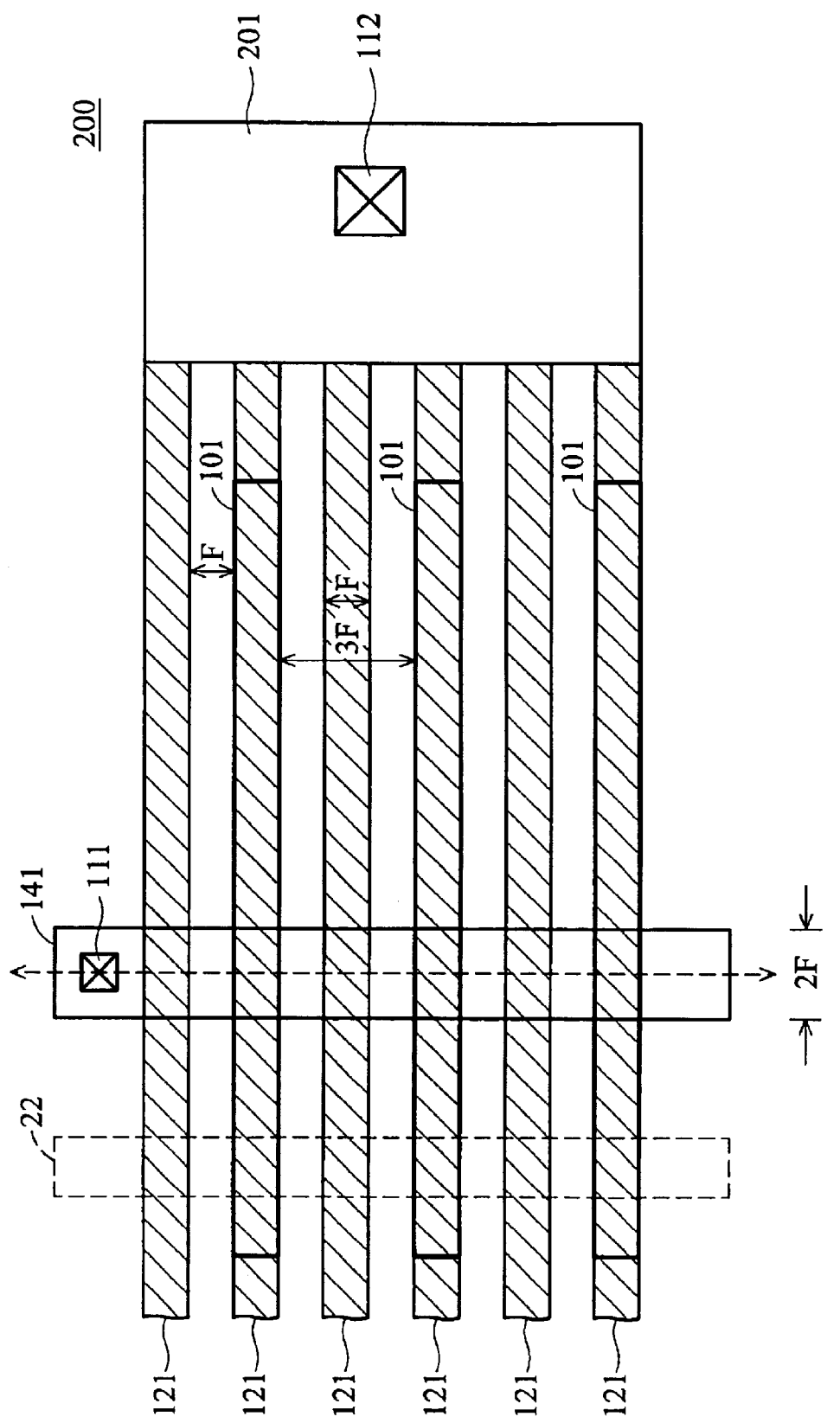
FIG. 3 shows a layout of a measuring apparatus of the present invention.

FIG. 1 shows a layout of a memory cell in a memory cell area of the present invention, FIG. 2 is a cross-section of the memory cell of the present invention, and FIG. 3 shows the layout of a measuring apparatus of the present invention. A wafer is first provided. A plurality of memory cells is formed on a memory cell area 100 of the wafer, and a measuring apparatus 200 is formed on the scribe line region of the wafer.

In FIGS. 1 and 2, a plurality of trench capacitors is disposed on a substrate of the memory cell area 100, and the adjacent trench capacitors 10 are arranged in a separation region. A plurality of active areas 14 is disposed on the substrate in a horizontal direction, and each active area 14 is formed above each trench 10. A plurality of wordlines 12 is disposed on the substrate in a perpendicular direction. A gate structure GC is disposed between each wordline 12 and the trench capacitor 10 thereunder. The conducting layer 16, an insulating layer GOX, and a doping area 18 respectively act as a gate, a gate oxide layer, and a source of a vertical transistor. The doping area 18 is electrically connected to a corresponding trench capacitor 10.

Figure 4:
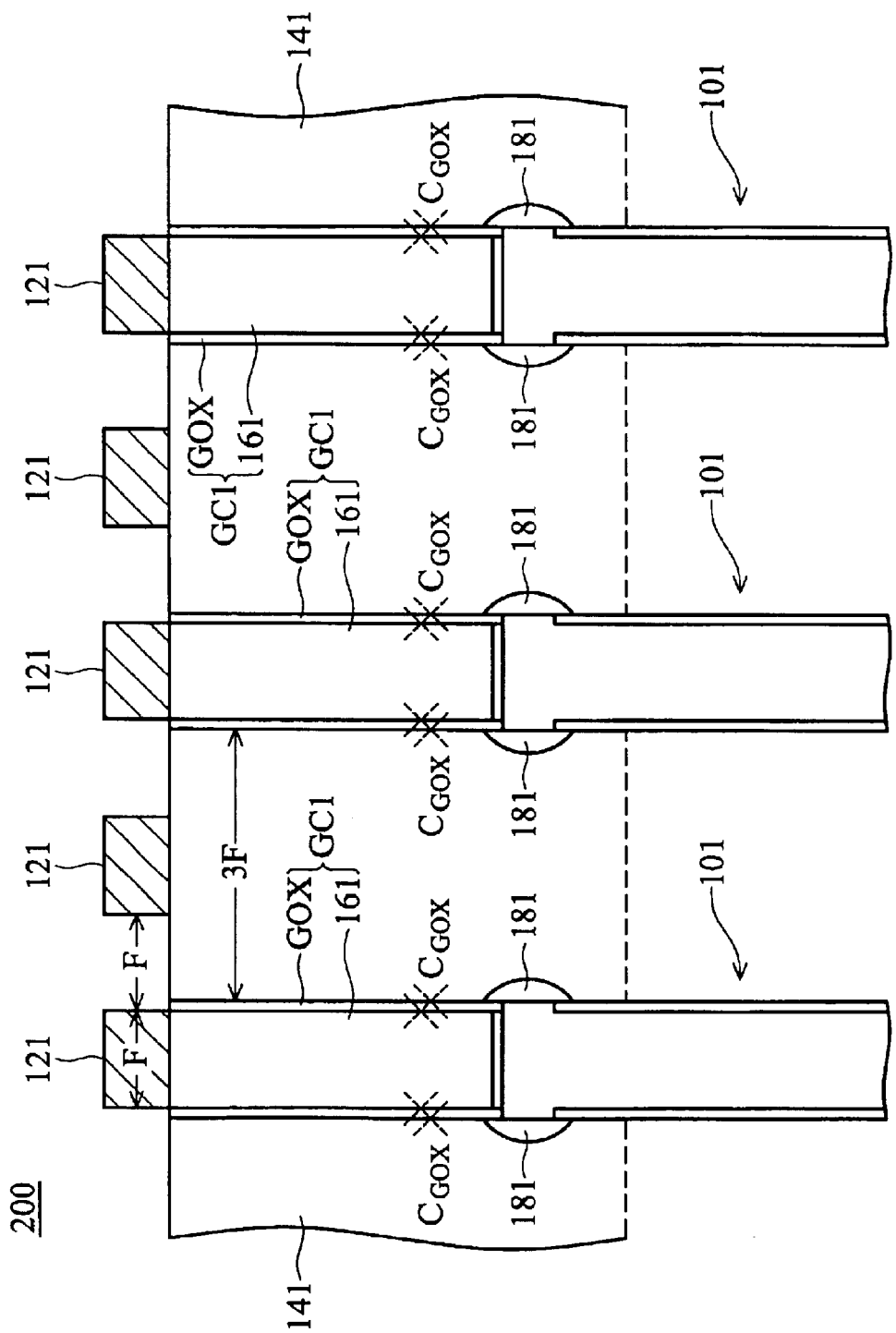
FIG. 4 is a cross-section of the measuring apparatus of the present invention.

In FIGS. 3 and 4, in the measuring apparatus 200 of the present invention, a first active area 141 is disposed on a substrate, and a width of the first active area 141 is a predetermined width of at least 2F. Wordlines 121 are disposed on the substrate in a first direction, with a minimum line width F between each two wordlines, each wordline has a first end, and the first ends are electrically connected. In the embodiment, the first ends of the wordlines 121 are electrically connected by a first conducting layer 201. Bar-shaped trench capacitors 101 are disposed on the substrate, with a predetermined space of about 3F between each two bar-shaped trench capacitors 101. A first trench capacitor 101 and a second trench capacitor 101 are longer than the first active area 141. The wordlines 121 are disposed above the corresponding bar-shaped trench capacitors 101, and electrically connected to the corresponding bar-shaped trench capacitors 101. The gate structures GC are disposed between the bar-shaped trench capacitor 101 and the wordlines 121, each gate structure GC includes a gate conducting layer 161 and a gate oxide layer GOX, and each gate conducting layer 161 is electrically connected to the corresponding wordline 121. A doped layer 22 is disposed on the substrate under a second end of each wordline 121.

Hereinafter, the method for forming the structures of the present invention is described.

In the embodiment, when the trench capacitors 10 (in FIG. 1 and FIG. 2) of the memory cell are formed on the memory cell area of the wafer, the bar-shaped trench capacitors 101 are formed on the scribe line region of the wafer using the same mask and process parameters at the same time. The width of the trench capacitor 101 is 1F, and the space between each two trench capacitors 101 is 3F, wherein F is a minimum line width of one wordline.

Afterward, when the active areas 14 on the memory cell area are defined, the active areas 141 are defined on the scribe line region of the wafer at the same time using the same mask and process parameters. The width of each active area 141 is 2F, and each active area 141 is approximately perpendicular to each bar-shaped trench capacitor 101.

Thereafter, when the gate structures GC are formed on the memory cell area 100, gate structures GC1 are formed above the corresponding bar-shaped trench capacitors 101 at the same time using the same mask and process parameters. Each gate structure GC1 has a gate conducting layer 161 and a gate oxide layer GOX.

When the wordlines 12 of the memory cells on the memory cell area 100 are formed, wordlines 121 are formed in the active areas 141 on the scribe line at the same time using the same mask and process parameters. The wordlines 121 are disposed in parallel on the scribe line, and the space between each two wordlines 121 is a minimum line width F. Further, each gate structure GC1 is electrically connected to the corresponding wordline formed thereon.

Hereinafter, the method for measuring the thickness of the gate oxide is described.

An equivalent capacitance between the first conducting layer 121 and the active area 141 is measured. A thickness of the gate oxide layer GOX of the measuring apparatus is estimated according to the equivalent capacitance. In the embodiment, a capacitor $C_{GOX}$ structure comprises the active area 141, the wordline 121, and the gate oxide layer GOX.

Figure 5A:
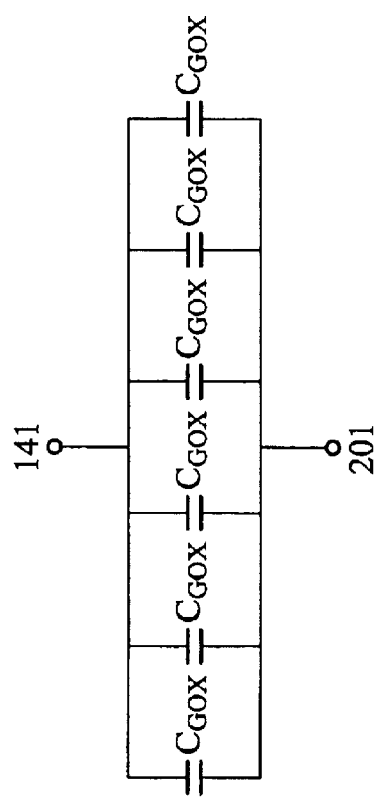
FIGS. 5a and 5b are equivalent circuit diagrams of the capacitor of the present invention.
Figure 5B:

For example, the active area 141 acts as an upper plate, the gate oxide GOX acts as an insulating layer of the capacitor $C_{GOX}$, and the wordline 121 acts as a bottom plate of the capacitor $C_{GOX}$. Therefore, an equivalent capacitance $C_S$ is measured between the wordline 121 and the active area 141, and the equivalent capacitance $C_S$ is connected in parallel to the capacitors $C_{GOX}$ in FIGS. 5a and 5b.

The thickness d of the gate oxide layer GOX of the measuring apparatus is obtained according to the formula:

$$C = \frac{\varepsilon}{d} \times A,$$

wherein C is the equivalent capacitance $C_S$, $\varepsilon$ is a dielectric constant of the gate oxide layer GOX, and A is a contact area between the gate oxide layer GOX of the measuring apparatus and the active area 141. Therefore, the thickness of the gate oxide layer GOX of the measuring apparatus may be obtained according to the capacitance $C_S$ of the present invention.

The gate structures GC on the memory cell area and the gate structures GC1 on the scribe line are formed using the same masks and the process parameters, and thus the gate oxide layer GOX of the vertical transistor on the memory cell area is obtained according to the thickness of the gate oxide layer GOX of the measuring apparatus.

In the present invention, the structures on the scribe line region and the memory cell area are fabricated simultaneously to reduce fabrication time, hence, the thickness of the gate oxide layer of the vertical transistor can be estimated, and the measuring apparatus does not occupy space in the memory cell area.

Figure 6:
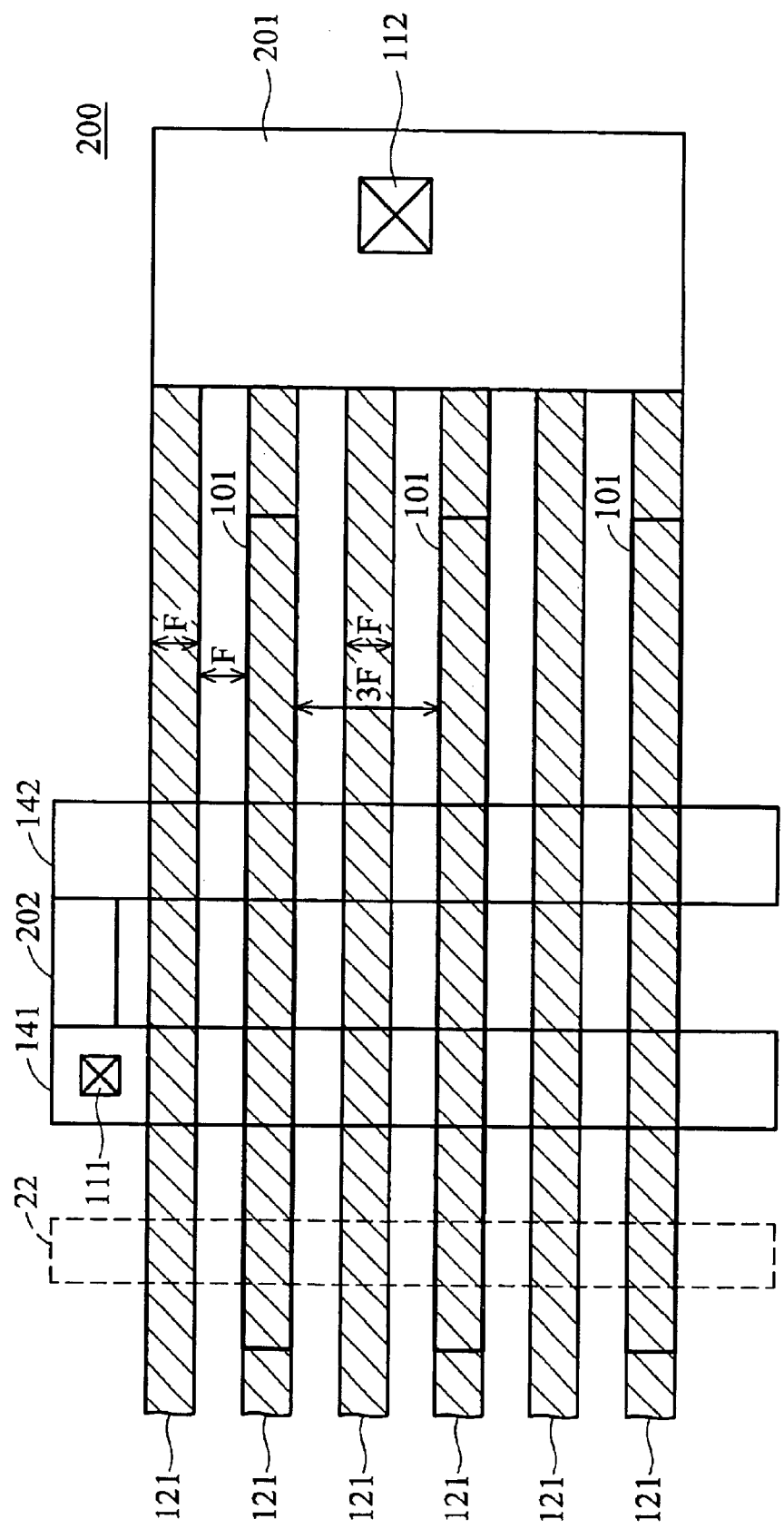
FIG. 6 shows another layout of the measuring apparatus of the present invention.

In FIG. 6, the measuring apparatus of the present invention further comprises a second active area 142, and a width of the active area 142 is at least 2F. The second active area 142 is disposed on the substrate in a second direction with the first active area 141, and the first active area 141 is electrically connected to the second active area 142 by a second conducting layer 202. Similarly, the equivalent capacitance $C_S$ is measured between the first conducting layer 121 and the active areas 141 and 142.

The capacitor $C_{GOX}$ structure comprises the active areas 141 and 142, the wordline 121, and the gate oxide layer GOX. Therefore, the thickness of the gate oxide layer GOX of the measuring apparatus is obtained according to the formula:

$$C = \frac{\varepsilon}{d} \times A,$$

wherein C is the equivalent capacitance $C_S$, $\varepsilon$ is a dielectric constant of the gate oxide layer GOX, and A is a contact area between the gate oxide layer GOX of the measuring apparatus and the active areas 141 and 142. The gate structures GC on the memory cell area and the gate structures GC1 on the scribe lines are formed using the same masks and the process parameters, and thus the gate oxide layer GOX of the vertical transistor on the memory cell area is obtained according to the thickness of the gate oxide layer GOX of the measuring apparatus.

Similarly, the measuring apparatus and the measurement of the present invention can be executed by a plurality of active areas arranged in the horizontal direction, wherein the active areas are electrically connected with each other. That is, the active areas may be electrically connected with each other by a conducting layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A apparatus for measuring a gate oxide thickness, which is disposed in a scribe line region, comprising:
   a first active area disposed on a substrate, a width of the first active area is a predetermined width of at least 2F;
   first to fifth wordlines disposed on the substrate in a first direction, with a first predetermined space between each two wordlines, and the first ends of the first to fifth wordlines are electrically connected;
   first and second bar-shaped trench capacitors disposed under the second and the fourth wordlines respectively, with a second predetermined space between the first and second bar-shaped trench capacitors, the first and second bar-shaped trench capacitors are longer than the first active area;
   wherein the first space is smaller than the second space, and F is a minimum line width of the wordlines; and
   first and second gate structures respectively disposed between the first bar-shaped trench capacitor and the second wordline and between the second bar-shaped trench capacitor and the fourth wordline, each gate structure comprising a gate conducting layer and a gate oxide layer, wherein the gate conducting layers are electrically connected to the wordlines respectively.

2. The apparatus for measuring a gate oxide thickness of claim 1, wherein the first to fifth wordlines are electrically connected to a first conducting layer.

3. The apparatus for measuring a gate oxide thickness of claim 1, wherein the first predetermined space is the minimum line width F of each of the wordlines.

4. The apparatus for measuring a gate oxide thickness of claim 1, wherein the width of the second predetermined space is 3F.

5. The apparatus for measuring a gate oxide thickness of claim 1, further comprising a second active area having a predetermined width of at least 2F, the second active area disposed on the substrate in a second direction, and the first active area is connected to the second active area by a second conducting layer.

6. The apparatus for measuring a gate oxide thickness of claim 1, wherein the width of the second predetermined space is 3F.

7. The apparatus for measuring a gate oxide thickness of claim 1, further comprising a doped layer disposed on the substrate under a second end of each wordline.

8. The apparatus for measuring a gate oxide thickness of claim 1, wherein the first direction and the second direction are approximately perpendicular.

9. An apparatus for measuring a gate oxide thickness, which is disposed in a scribe line region, comprising:
   a first active area disposed on a substrate, a width of the first active area is a predetermined width of at least 2F;
   first to fifth wordlines disposed on the substrate in a first direction, with a minimum line width F between each two wordlines, and first ends of the first to fifth wordlines are electrically connected;
   first and second bar-shaped trench capacitors disposed under the second and fourth wordlines respectively, the first and second bar-shaped trench capacitors are longer than the first active area, and with a predetermined space with 3F between the first and second bar-shaped trench capacitors;
   first and second gate structures respectively disposed between the first bar-shaped trench capacitor and the second wordline and between the second bar-shaped trench capacitor and the fourth wordline, each gate structure comprising a gate conducting layer and a gate oxide layer, wherein the gate conducting layers are electrically connected to the wordlines respectively, and
   a doped layer disposed on the substrate under second ends of the first to fifth wordlines.

10. The apparatus for measuring a gate oxide thickness of claim 9, further comprising a second active area having a predetermined width of at least 2F, the second active area disposed on the substrate in a second direction, and the first active area is connected to the second active area by a second conducting layer.

11. The apparatus for measuring a gate oxide thickness of claim 9, wherein the first to fifth wordlines are electrically connected to a first conducting layer.

12. The apparatus for measuring a gate oxide thickness of claim 9, wherein the first direction and the second direction are approximately perpendicular.

13. A gate oxide thickness measurement, comprising:
   providing a wafer with a scribe line and a memory cell area;
   forming a measuring apparatus on the scribe line, and forming a plurality of memory cells with vertical transistors in the memory cell area, wherein each vertical transistor has a gate oxide layer,
   wherein the measuring apparatus comprises:
      a first active area disposed on a substrate,
         a width of the first active area is a predetermined width of at least 2F;
      first to fifth wordlines disposed on the substrate in a first direction, with a minimum line width F between each two wordlines, and first ends of the first to fifth wordlines are electrically connected;
      first and second bar-shaped trench capacitors disposed under the second and fourth wordlines respectively, the first and second bar-shaped trench capacitors are longer than the first active area, and with a predetermined space of 3F between the first and second bar-shaped trench capacitors;
      first and second gate structures respectively disposed between the first bar-shaped trench capacitor and the second wordline and between the second bar-shaped trench capacitor and the fourth wordline, each gate structure comprising a gate conducting layer and a gate oxide layer, wherein the gate conducting layers are electrically connected to the wordlines respectively;
   measuring a equivalent capacitance between the first conducting and the first active area;
   estimating a thickness of the gate oxide layer of the measuring apparatus according to the equivalent capacitance; and
   estimating a thickness of the gate oxide layer of each vertical transistor according to the thickness of the gate oxide layer of the measuring apparatus.

14. The gate oxide thickness measurement of claim 9, wherein the thickness d of the gate oxide layer of the measuring apparatus is obtained by a formula:

$$C = \frac{\varepsilon}{d} \times A,$$

wherein C is the equivalent capacitance, $\varepsilon$ is a dielectric constant of the gate oxide layer, and A is a contact area between the gate oxide layer of the measuring apparatus and the first active area.

* * * * *